United States Patent [19]
Yoshikawa et al.

[11] Patent Number: 5,933,757
[45] Date of Patent: Aug. 3, 1999

[54] ETCH PROCESS SELECTIVE TO COBALT SILICIDE FOR FORMATION OF INTEGRATED CIRCUIT STRUCTURES

[75] Inventors: Stephanie A. Yoshikawa, Palo Alto; Wilbur G. Catabay, Saratoga, both of Calif.

[73] Assignee: LSI Logic Corporation, Milpitas, Calif.

[21] Appl. No.: 08/879,659

[22] Filed: Jun. 23, 1997

[51] Int. Cl.$^6$ .................................................. H01L 21/465
[52] U.S. Cl. .......................... 438/682; 438/754; 438/755
[58] Field of Search .................................. 438/655, 656, 438/682, 683, 754, 755

[56] References Cited

U.S. PATENT DOCUMENTS

| | | |
|---|---|---|
| 5,047,367 | 9/1991 | Wei et al. . |
| 5,567,651 | 10/1996 | Berti et al. . |
| 5,736,461 | 4/1998 | Berti et al. ............................... 438/651 |

*Primary Examiner*—Caridad Everhart
*Attorney, Agent, or Firm*—John P. Taylor

[57] ABSTRACT

An etch process selective to cobalt silicide is described for the selective removal of titanium and/or titanium nitride, unreacted cobalt, and cobalt reaction products other than cobalt silicide, remaining after the formation of cobalt silicide on an integrated circuit structure on a semiconductor substrate in preference to the removal of cobalt silicide. The first step comprises contacting the substrate with an aqueous mixture of ammonium hydroxide ($NH_4OH$) and hydrogen peroxide ($H_2O_2$) to selectively remove any titanium and/or titanium nitride in preference to the removal of cobalt silicide. The second step comprises contacting the substrate with an aqueous mixture of phosphoric acid ($H_3PO_4$), acetic acid ($CH_3COOH$), and nitric acid ($HNO_3$) to selectively remove cobalt and cobalt reaction products (other than cobalt silicide) in preference to the removal of cobalt silicide. In a preferred embodiment, the substrate is contacted by the respective etchant systems by spraying the respective etchant mixtures onto the substrate rather than immersing the substrate into baths containing the respective etchant mixtures.

19 Claims, 1 Drawing Sheet

FORMING A LAYER OF COBALT ON A SILICON SURFACE OF AN INTEGRATED CIRCUIT STRUCTURE ON A SEMICONDUCTOR SUBSTRATE, AND FORMING DUAL CAPPING LAYERS OF TITANIUM AND TITANIUM NITRIDE OVER THE COBALT LAYER

ANNEALING THE SUBSTRATE AT A TEMPERATURE OF ABOUT 425°C TO ABOUT 475°C TO FORM COBALT SILICIDE THEREON

CONTACTING THE SUBSTRATE WITH A FIRST AQUEOUS ETCHANT MIXTURE OF AMMONIUM HYDROXIDE AND HYDROGEN PEROXIDE TO SELECTIVELY REMOVE THE TITANIUM AND TITANIUM NITRIDE CAPPING LAYERS REMAINING ON THE SUBSTRATE IN PREFERENCE TO THE COBALT SILICIDE

CONTACTING THE SUBSTRATE WITH A SECOND AQUEOUS ETCHANT MIXTURE OF PHOSPHORIC ACID, ACETIC ACID, AND NITRIC ACID TO SELECTIVELY REMOVE UNREACTED COBALT AND COBALT REACTION PRODUCTS OTHER THAN COBALT SILICIDE FROM THE SUBSTRATE IN PREFERENCE TO COBALT SILICIDE

ETCH PROCESS SELECTIVE TO COBALT SILICIDE FOR FORMATION OF INTEGRATED CIRCUIT STRUCTURES

BACKGROUND OF THE INVENTION

1. Field of the Invention

This invention relates to formation of integrated circuit structures. More particularly, this invention relates to an etch process for removal of materials remaining from the formation of cobalt silicide on an integrated circuit structure on a semiconductor substrate in preference to the removal of cobalt silicide.

2. Description of the Related Art

In the formation of integrated circuit structures, and particularly in the formation of MOS devices using polysilicon gate electrodes, it has become the practice to provide a metal silicide layer over the polysilicon gate electrode, and over the source/drain regions of the silicon substrate, to facilitate electrically and metallurgically connecting the silicon to metal interconnects. Thus, for example, a metal layer capable of reacting with silicon to form a conductive metal silicide is usually blanket deposited over the polysilicon gate electrode and the source/drain regions of the silicon substrate, as well as over the silicon oxide insulation regions of the substrate, e.g., the field oxide regions. The structure is then heated sufficiently to cause the metal in contact with the silicon to react, thereby forming the desired metal silicide.

While titanium silicide has been widely used in the past, as the dimensions of the integrated circuit structure have become smaller, the use of cobalt silicide ($CoSi_2$) is becoming preferred over titanium silicide because of certain problems encountered in the use of titanium silicide in the formation of narrow lines. However, cobalt does not reduce oxide as well as titanium, and thus the cleanliness of the semiconductor substrate is much more critical if cobalt is used to form the desired metal silicide.

It has been proposed in the past to form a capping layer of titanium metal or titanium nitride over the cobalt layer prior to formation of the cobalt silicide to avoid some of these problems.

More recently, in copending patent application Ser. No. 08/833,597, pending, entitled "PROCESS FOR FORMING IMPROVED COBALT SILICIDE LAYER ON INTEGRATED CIRCUIT STRUCTURE USING TWO CAPPING LAYERS", which was filed by us with another inventor on Apr. 7, 1997, assigned to the assignee of the assignee of this invention, and the subject matter of which is hereby incorporated by reference, we proposed to form a dual capping layer of titanium metal and titanium nitride over a cobalt layer prior to silicide formation to thereby form a colbalt silicide layer of more even thickness. Since it is very desirable to form a cobalt silicide layer of uniform thickness for purposes of subsequent implantation, the use of such a dual capping structure to provide such a uniform thickness cobalt silicide layer is also desirable. However, the use of such a dual capping layer, in turn, requires the removal of a number of different materials after the cobalt silicide layer is formed, including unreacted cobalt, titanium, and titanium nitride, as well as any other reaction products of cobalt other than the desired cobalt silicide layer. Such selective removal, in turn, requires an etch system which is capable of removing all such materials while being highly selective to cobalt silicide, i.e., which will remove such materials as unreacted cobalt or other cobalt reaction products, as well as titanium and titanium nitride, without removing any substantial amount of cobalt silicide.

It would, thereby, be desirable to provide an etch system which will remove unreacted cobalt, and titanium and/or titanium nitride, as well as any other reaction products of cobalt other than the desired cobalt silicide layer, while exhibiting high selectivity with respect to cobalt silicide.

SUMMARY OF THE INVENTION

In accordance with the invention, an etch process capable of removing titanium and/or titanium nitride, unreacted cobalt, and cobalt reaction products other than cobalt silicide, after the formation of cobalt silicide on an integrated circuit structure on a semiconductor substrate, comprises a first step of contacting the substrate with an aqueous mixture of ammonium hydroxide ($NH_4OH$) and hydrogen peroxide ($H_2O_2$) to selectively remove titanium and/or titanium nitride in preference to the removal of cobalt silicide, followed by a second step of contacting the substrate with an aqueous mixture of phosphoric acid ($H_3PO_4$), acetic acid ($CH_3COOH$), and nitric acid ($HNO_3$) to selectively remove cobalt and cobalt reaction products other than cobalt silicide in preference to the removal of cobalt silicide. In a preferred embodiment, the substrate is contacted by the respective etchant systems by spraying the respective aqueous mixtures onto the substrate rather than immersing the substrate into baths containing the respective aqueous mixtures.

BRIEF DESCRIPTION OF THE DRAWINGS

The sole drawing is a flow sheet illustrating the process of the invention.

DETAILED DESCRIPTION OF THE INVENTION

The invention comprises a selective etch process for the removal of titanium and/or titanium nitride capping layers, as well as unreacted cobalt, and cobalt reaction products other than cobalt silicide, after the formation of cobalt silicide on an integrated circuit structure on a semiconductor substrate. The etch process comprises a first step of contacting the substrate with a first aqueous etchant mixture of ammonium hydroxide ($NH_4OH$) and hydrogen peroxide ($H_2O_2$) to selectively remove titanium and titanium nitride in preference to the removal of cobalt silicide, followed by a second step of contacting the substrate with a second aqueous etchant mixture of phosphoric acid ($H_3PO_4$), acetic acid ($CH_3COOH$), and nitric acid ($HNO_3$) to selectively remove cobalt and cobalt reaction products other than cobalt silicide in preference to the removal of cobalt silicide. In a preferred embodiment, the substrate is contacted by the respective etchant mixture by spraying the respective aqueous etchant mixtures onto the substrate rather than immersing the substrate into baths containing the respective aqueous mixtures.

By use of terms herein such as "selectively removing . . . in preference to the removal of cobalt silicide" or "selective to cobalt silicide", is meant that during the complete removal of the undesired materials such as titanium, titanium nitride, unreacted cobalt, or cobalt reaction products (other than cobalt silicide), less than 20 wt. % of the cobalt silicide will be attacked and removed by the etchants used in the process of the invention.

Initially a layer of cobalt is formed over exposed silicon surfaces of an integrated circuit structure formed on a semiconductor substrate. After formation of the cobalt layer one or more capping layers are formed over the cobalt layer to protect the cobalt layer during the initial annealing step, resulting in the formation of a cobalt silicide layer of more uniform thickness. Either a titanium capping layer or a titanium nitride capping layer may be utilized. Preferably, however, a dual capping structure comprising a titanium layer and a tintaium nitride layer is utilized. The structure is then annealed at a first annealing temperature, which may range from about 425° C. to about 475° C., to form cobalt silicide.

The titanium and/or titanium nitride capping layers are then removed, after the formation of the desired cobalt silicide on the integrated circuit structure on the semiconductor substrate, by contacting the substrate with a first aqueous etchant mixture of ammonium hydroxide ($NH_4OH$) and hydrogen peroxide ($H_2O_2$) for a period of from about 30 seconds to about 10 minutes, while maintaining the first etchant mixture at a temperature ranging from about 20° C. to about 60° C. The concentration of the $NH_4OH$ in the first etchant mixture ranges from about 60 vol. % to about 90 vol. %, while the concentration of the $H_2O_2$ in the first etchant mixture ranges from about 10 vol. % to about 40 vol. %.

Preferably, the substrate is treated with the first etchant mixture by spraying the etchant mixture over the surface of the substrate. The use of a spraying technique, rather than the more conventional immersing of the substrate into a bath, ensures the continuous contact of the substrate with a fixed or constant concentration of the etchant mixture throughout the treatment time, since the titanium and titanium nitride materials being removed will wash off the substrate and not affect the further treatment of the substrate as would the presence of such removed materials in a bath which would tend to dilute the bath as such materials accumulated in the bath. Furthermore, the application of the etchant mixture to the substrate by spraying permits the collection (and discarding) of the initial runoff of the mixture of etchant mixture and materials removed by the first etchant mixture (which will have a high concentration of the materials removed by the first etchant mixture), followed by collection of the remaining first etchant mixture (containing dilute amounts of removed titanium and titanium nitride) for purification and subsequent recycling of the first etchant mixture. Apparatus which can be used in such a spraying process is available from the Semitool Company as a spray etch tool. Following treatment of the substrate with the first etchant mixture to remove the titanium and titanium nitride materials comprising the two capping layers used in forming the cobalt silicide, the substrate is rinsed in water, e.g., deionized water, to remove the first etchant mixture as well as any remaining materials selectively etched from the substrate by the first etchant treatment. This rinse step may be carried out by spraying the substrate with water at room temperature for a period ranging from about 1 to about 3 minutes.

Following this first etch treatment to remove the titanium and titanium nitride capping materials, the unreacted cobalt and cobalt reaction products (other than the cobalt silicide formed on the integrated circuit structure) are removed by treating the substrate with a second aqueous etchant mixture consisting of phosphoric acid, acetic acid, and nitric acid. This treatment is carried out for a period of from about 30 seconds to about 30 minutes, while maintaining the second etchant mixture at a temperature ranging from about 20° C. to about 60° C. The concentration of the phosphoric acid in the second etchant mixture ranges from about 50 vol. % to about 80 vol. %, the concentration of the acetic acid in the second etchant mixture ranges from about 1 vol. % to about 20 vol. %, and the concentration of the nitric acid in the second etchant mixture ranges from about 1 vol. % to about 20 vol. %. Such an etchant mixture is commercially available from the Cyantek Corporation as an A1 etch called A1-30.

As with the first etch treatment to remove the titanium and titanium nitride, preferably, the substrate is also treated with the second etchant mixture by spraying the second etchant mixture over the surface of the substrate. Following treatment of the substrate with the second etchant mixture to remove the unreacted cobalt and unwanted cobalt reaction products formed during the formation of the cobalt silicide, the substrate is again washed in water, such as deionized water, to remove the second etchant mixture as well as any other materials selectively etched from the substrate by the second etchant treatment. This rinse step, like the prior rinse step, may be carried out by spraying the substrate with water at a temperature of from about room temperature to about 80° C. for a period ranging from about 1 to about 3 minutes.

Following the removal of the titanium and titanium nitride capping layers, and the unreacted cobalt and undesired cobalt reaction products, by the two step etch process of the invention, conventional processing of the cobalt silicide is resumed by subjecting the cobalt silicide to a further, higher temperature, anneal as is known in the art.

To further illustrate the invention, a silicon substrate was covered with a 190 Angstrom thick cobalt layer in a vacuum apparatus. An 80 Angstrom thick titanium capping layer was then deposited over the cobalt layer in the same vacuum apparatus. The structure was then subject to a first anneal in an annealing chamber for about 60 seconds at about 450° C. to form the initial cobalt silicide.

In accordance with the invention, the titanium capping layer was then removed by spraying the substrate with the first etchant mixture (the aqueous ammonium hydroxide and hydrogen peroxide mixture) at room temperature for a period of about 4 minutes. The substrate was then rinsed by spraying with room temperature deionized water for about 3 minutes. The substrate was then sprayed with the second etchant mixture (the phosphoric acid, acetic acid, nitric acid mixture) at room temperature for a period of about 10 minutes to remove the unreacted cobalt, as well as cobalt reaction products other than the desired cobalt silicide. The substrate was then again rinsed by spraying with room temperature deionized water for about 3 minutes.

The cobalt silicide was then further annealed by heating the substrate to a temperature of about 750° C. for a period of about 60 seconds to form the desired higher temperature cobalt silicide product. The sheet resistance of the resulting high temperature annealed cobalt silicide formed on the substrate was then measured and found to be 3 $\Omega/\square$, indicative of the complete removal of the titanium, unreacted cobalt, and undesired cobalt reaction products. This complete removal of these undesired materials was then further verified by EDS (energy dispersive spectroscopy). Similar results can be obtained using a titanium nitride capping layer or mutiple layers, consisting of a titanium capping layer and a titanium nitride capping layer.

Thus, the invention provides a process for selective removal of the titanium and titanium nitride capping layers formed over a layer of cobalt to protect the cobalt layer from oxygen and other contaminants which would otherwise prevent formation of a cobalt silicide layer of uniform thickness; and for subsequent selective removal of the unreacted cobalt and undesired cobalt reaction products (i.e., the cobalt compounds formed during the anneal other than cobalt silicide). The etchant mixtures used in each of the two etch steps is highly selective to cobalt silicide, i.e., the titanium, titanium nitride, unreacted cobalt, and other cobalt reaction products are removed by the respective etchants, in preference to removal of the cobalt silicide.

Having thus described the invention what is claimed is:

1. A process for selectively removing materials remaining from the formation of cobalt silicide on an integrated circuit structure on a semiconductor substrate, including titanium and/or titanium nitride capping materials, in preference to the removal of cobalt silicide, which comprises:
   a) treating said substrate with a first aqueous etchant mixture consisting essentially of ammonium hydroxide ($NH_4OH$) and hydrogen peroxide ($H_2O_2$) to remove any titanium and titanium nitride;
   b) then rinsing said substrate to remove said first aqueous etchant mixture from said substrate; and
   c) then treating said substrate with a second aqueous etchant mixture consisting essentially of phosphoric acid ($H_3PO_4$), acetic acid ($CH_3COOH$), and nitric acid ($HNO_3$) to remove unreacted cobalt and cobalt reaction products other than cobalt silicide.

2. The process of claim 1 which includes the further step of rinsing said substrate after said second step of treating said substrate.

3. The process of claim 1 wherein said capping materials consist essentially of a titanium capping layer and said first step of treating said substrate with a first aqueous etchant mixture consisting essentially of ammonium hydroxide ($NH_4OH$) and hydrogen peroxide ($H_2O_2$) further comprises removing said titanium capping layer with said first aqueous etchant mixture.

4. The process of claim 1 wherein said capping materials consist essentially of a titanium nitride capping layer and said first step of treating said substrate with a first aqueous etchant mixture consisting essentially of ammonium hydroxide ($NH_4OH$) and hydrogen peroxide ($H_2O_2$) further comprises removing said titanium nitride capping layer with said first aqueous etchant mixture.

5. The process of claim 1 wherein said first step of treating said substrate further comprises spraying said substrate with said first aqueous etchant mixture.

6. The process of claim 5 wherein said first step of spraying said substrate with said first aqueous etchant mixture further comprises spraying said substrate at a temperature of from about 20° C. to about 60° C. for a period of from about 30 seconds to about 10 minutes.

7. The process of claim 1 wherein said second step of treating said substrate further comprises spraying said substrate with said second aqueous etchant mixture.

8. The process of claim 7 wherein said second step of spraying said substrate with said second aqueous etchant mixture further comprises spraying said substrate at a temperature of from about 20° C. to about 60° C. for a period of from about 30 seconds to about 30 minutes.

9. A process for selectively removing materials remaining from the formation of cobalt silicide on an integrated circuit structure on a semiconductor substrate, including titanium and/or titanium nitride capping materials, in preference to the removal of cobalt silicide, which comprises:
   a) spraying said substrate with a first aqueous etchant mixture consisting essentially of ammonium hydroxide ($NH_4OH$) and hydrogen peroxide ($H_2O_2$) to remove any titanium and titanium nitride;
   b) then rinsing said substrate to remove said first aqueous etchant mixture from said substrate; and
   c) then spraying said substrate with a second aqueous etchant mixture consisting essentially of phosphoric acid ($H_3PO_4$), acetic acid ($CH_3COOH$), and nitric acid ($HNO_3$) to remove unreacted cobalt and cobalt reaction products other than cobalt silicide.

10. The process of claim 9 which includes the further step of rinsing said substrate with deionized water after said second step of spraying said substrate.

11. The process of claim 9 wherein said capping materials consist essentially of a titanium capping layer and said first step of spraying said substrate with a first aqueous etchant mixture consisting essentially of ammonium hydroxide ($NH_4OH$) and hydrogen peroxide ($H_2O_2$) further comprises removing said titanium capping layer with said first aqueous etchant mixture.

12. The process of claim 9 wherein said capping materials consist essentially of a titanium nitride capping layer and said first step of spraying said substrate with a first aqueous etchant mixture consisting essentially of ammonium hydroxide ($NH_4OH$) and hydrogen peroxide ($H_2O_2$) further comprises removing said titanium nitride capping layer with said first aqueous etchant mixture.

13. The process of claim 9 wherein said first step of spraying said substrate with said first aqueous etchant mixture further comprises spraying said substrate at a temperature of from about 20° C. to about 60° C. for a period of from about 30 seconds to about 10 minutes.

14. The process of claim 9 wherein said second step of spraying said substrate with said second aqueous etchant mixture further comprises spraying said substrate at a temperature of from about 20° C. to about 60° C. for a period of from about 30 seconds to about 30 minutes.

15. A process for selectively removing materials remaining from the formation of cobalt silicide on an integrated circuit structure on a semiconductor substrate, including titanium and/or titanium nitride capping materials, in preference to the removal of cobalt silicide, which comprises:
   a) spraying the substrate with a first aqueous etchant mixture-consisting essentially of ammonium hydroxide ($NH_4OH$) and hydrogen peroxide ($H_2O_2$) at a temperature of from about 20° C. to about 60° C. for a period of from about 30 seconds to about 10 minutes to remove any titanium and titanium nitride;
   b) rinsing said substrate with deionized water after said first step of treating said substrate;
   c) spraying the substrate with a second aqueous etchant mixture consisting essentially of phosphoric acid ($H_3PO_4$), acetic acid ($CH_3COOH$), and nitric acid ($HNO_3$) at a temperature of from about 20° C. to about 60° C. for a period of from about 30 seconds to about 30 minutes to remove unreacted cobalt and cobalt reaction products other than cobalt silicide; and
   d) rinsing said substrate with deionized water after said second step of treating said substrate.

16. A process for forming cobalt silicide on an integrated circuit structure of a semiconductor substrate including the selective removal of materials remaining from the formation of cobalt silicide, comprising titanium and titanium nitride capping materials, unreacted cobalt, and cobalt reaction products other than cobalt silicide in preference to the removal of cobalt silicide, which comprises:
   a) forming a layer of cobalt on a silicon surface of an integrated circuit structure on a semiconductor substrate;
   b) forming dual capping layers, respectively comprising titanium and titanium nitride, over said cobalt layer;
   c) annealing said substrate at a first temperature to form said cobalt silicide;
   d) contacting said substrate with a first aqueous etchant mixture of ammonium hydroxide and hydrogen peroxide to selectively remove said titanium and titanium nitride in preference to the removal of said cobalt silicide; and e) then rinsing said substrate to remove said first aqueous etchant mixture from said substrate; and f) then contacting said substrate with a second aqueous etchant mixture of phosphoric acid, acetic acid, and nitric acid to selectively remove said unreacted cobalt and cobalt reaction products other than cobalt silicide in preference to the removal of said cobalt silicide.

17. The process of claim 16 which includes the further step of rinsing said substrate after said step of contacting said substrate with said second aqueous etchant mixture, to remove said second aqueous etchant mixture from said substrate.

18. The process of claim 1 wherein said capping materials consist essentially of a titanium nitride capping layer and a titanium capping layer, and said first step of treating said substrate with a first aqueous etchant mixture consisting essentially of ammonium hydroxide ($NH_4OH$) and hydrogen peroxide ($H_2O_2$) further comprises removing both said titanium nitride capping layer and said titanium capping layer with said first aqueous etchant mixture.

19. The process of claim 9 wherein said capping materials consist essentially of a titanium nitride capping layer and a titanium capping layer, and said first step of spraying said substrate with a first aqueous etchant mixture consisting essentially of ammonium hydroxide ($NH_4OH$) and hydrogen peroxide ($H_2O_2$) further comprises removing both said titanium nitride capping layer and said titanium capping layer with said first aqueous etchant mixture.

* * * * *